United States Patent
Shi

(10) Patent No.: US 9,614,534 B1
(45) Date of Patent: Apr. 4, 2017

(54) DIGITAL DELAY-LOCKED LOOP AND LOCKING METHOD THEREOF

(71) Applicant: MONTAGE TECHNOLOGY (SHANGHAI) CO., LTD., Shanghai (CN)

(72) Inventor: Mingfu Shi, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/161,764

(22) Filed: May 23, 2016

(30) Foreign Application Priority Data

Sep. 22, 2015 (CN) .......................... 2015 1 06076831

(51) Int. Cl.
*H03L 7/081* (2006.01)
*H03L 7/18* (2006.01)

(52) U.S. Cl.
CPC .............. *H03L 7/0814* (2013.01); *H03L 7/18* (2013.01); *H03L 2207/12* (2013.01)

(58) Field of Classification Search
CPC .................................................... H03L 7/0814
See application file for complete search history.

(56) References Cited

U.S. PATENT DOCUMENTS 7,583,119 B2 * 9/2009 Song .................. H03L 7/0818
  327/149
8,125,254 B1 * 2/2012 Ding .................... H03L 7/089
  327/147

* cited by examiner

*Primary Examiner* — Hai L Nguyen
(74) *Attorney, Agent, or Firm* — Oliff PLC

(57) ABSTRACT

The digital delay-locked loop includes: a frequency divider, used to perform frequency division processing on a first clock-signal according to frequency division information, and output a second clock-signal; a signal-selector, used to select the first or second clock-signal as a third clock-signal according to the selection signal output; a delay line, used to delay the third clock-signal according to the delay control signal, and output a fourth clock-signal; a phase detector, used to receive the third and fourth clock-signals, perform phase detection processing, and output a phase detection judgment signal; and a state machine connected with the frequency divider, signal-selector, delay line and phase detector, used to adjust and control the frequency division information, the selection signal and the delay control signal output according to the phase detection judgment signal and a set state logic, to achieve that delay time of the fourth clock-signal relative to the first clock-signal.

11 Claims, 6 Drawing Sheets

DIGITAL DELAY-LOCKED LOOP AND LOCKING METHOD THEREOF

BACKGROUND OF THE PRESENT INVENTION

Field of Invention

The present invention relates to a circuit technology, specifically to a digital delay-locked loop and a locking method.

Description of Related Arts

A delay-locked loop (DLL) technology widely used currently is obtained through improvement of a PLL technology, and is widely used in the timing sequence field. It inherits a locked loop technology of a PLL circuit, but removes the oscillator part in the PLL circuit, and instead of this is a delay line with controllable delay amount. The existing general DLL design generally includes a delay line, a state machine and a phase detector, and the state machine adjusts the delay line through output of the phase detector to achieve locking of the output, but faces a harmonic locking problem. In order to solve the harmonic locking problem, the traditional DLL, in design of the delay line, makes the minimum delay time less than one cycle of an input clock signal, and increases a starting circuit to ensure that the DLL is finally locked to one cycle. However, for a high-speed clock signal and a high-resolution digital delay-locked loop, due to its short cycle, more stages of basic delay cells and influences of the circuit parasitic effect, the minimum delay time of the whole delay line usually exceeds one cycle. In this case, the method for the traditional DLL to avoid harmonic periods is no longer applicable.

In view of this, how to design a digital delay-locked loop applicable to that the minimum delay time exceeds one clock cycle becomes a problem to be urgently solved by those skilled in the art.

SUMMARY OF THE PRESENT INVENTION

In view of the shortcomings of the prior art, an object of the present invention is to provide a digital delay-locked loop and a locking method thereof, used to solve the problem that the digital delay-locked loop is not applicable in the situation where the minimum delay time exceeds one clock cycle in the prior art.

In order to accomplish the above object and other related objects, the present invention provides a digital delay-locked loop, which comprises: a frequency divider, used to receive a first clock signal and frequency division information, perform frequency division processing on the first clock signal according to the frequency division information, and output a second clock signal, wherein the frequency division information comprises a specified dividing ratio signal and a specified duty cycle; a signal selector connected with the frequency divider, used to receive the first clock signal, the second clock signal and a selection signal, and select the first clock signal or the second clock signal as a third clock signal output according to the selection signal; a delay line connected with the signal selector, used to receive the third clock signal and a delay control signal, delay the third clock signal according to the delay control signal, and output a fourth clock signal; a phase detector connected with the signal selector and the delay line, used to receive the third clock signal and the fourth clock signal, perform phase detection processing, and output a phase detection judgment signal; and a state machine connected with the frequency divider, the signal selector, the delay line and the phase detector, used to receive the phase detection judgment signal, and adjust the frequency division information, the selection signal and the delay control signal output according to the phase detection judgment signal and a set state logic, to achieve that delay time of the fourth clock signal relative to the first clock signal is a multiple of a cycle of the first clock signal.

Optionally, the delay line comprises N identical delay cells connected in series, N is a natural number, input of the first delay cell connected in series is input of the delay line, and output of the last delay cell connected in series is output of the delay line; each delay cell receives the delay control signal, performs corresponding delay processing on the clock signal input in the delay cell according to the delay control signal, and outputs a delayed clock signal.

Optionally, the delay line further outputs N phase clock signals; when N>=2, the N phase clock signals are respectively input signals of the N delay cells connected in series.

Optionally, the digital delay-locked loop further comprises a clock phase switching circuit, which comprises N input ends, N output ends and a control end; the N phase clock signals output by the delay line are input to N input ends of the clock phase switching circuit; the state machine is further used to determine and output a phase swap signal according to the set state logic, and the control end of the clock phase switching circuit receives the phase swap signal, and adjusts output positions of each input signal according to the phase swap signal, to ensure that a phase difference between signals output by any two adjacent positions of the N output ends is 1/N of the clock cycle of the first clock.

Optionally, the N is an even number, and the clock phase switching circuit outputs a clock signal of even phase.

Optionally, the N may also be an odd number, and the clock phase switching circuit outputs a clock signal of odd phase.

The present invention further provides a digital delay-locked loop locking method, applied to the digital delay-locked loop as described above, wherein the digital delay-locked loop locking method comprises: setting a delay control signal, to make the delay line generate minimum delay time; selecting a frequency division clock signal generated by the frequency divider as an input signal of the delay line, and performing feedback adjustment on the frequency division information according to the obtained phase detection judgment signal, to lock a range of the minimum delay time, wherein the frequency division signal comprising a frequency dividing ratio with the specified duty cycle; after the range of the minimum delay time is locked, resetting the frequency division information to cause the frequency divider to output a new frequency dividing ratio and a duty ratio; and adjusting the delay control signal according to the obtained phase detection judgment signal, to cause the delay time of the delay line to be locked near cycles of an integral number of input clock signals corresponding to the minimum delay time.

Optionally, the digital delay-locked loop locking method further comprises: selecting the input clock signal of the digital delay-locked loop as the input signal of the delay line part, and finely adjusting the delay control signal according to the obtained phase detection judgment signal, to cause the delay time of the delay line to be locked on cycles of integer input clock signals corresponding to the range of the minimum delay time.

Optionally, the adjusting the delay control signal comprises: when a frequency division clock signal generated by the frequency divider is selected as an input signal of the delay line, roughly adjusting the delay control signal according to the obtained phase detection judgment signal, to cause the delay time of the delay line to be locked near cycles of an integral number of input clock signals corresponding to the minimum delay time; when the input clock signal of the digital delay-locked loop is selected as the input signal of the delay line, finely adjusting the delay control signal according to the obtained phase detection judgment signal, a delay range produced by one-time fine adjustment being less than that produced by one-time rough adjustment, to cause the delay time of the delay line part to be locked on the cycles of an integral number of input clock signals corresponding to the minimum delay time.

Optionally, the digital delay-locked loop locking method further comprises: when the continuous increasing or decreasing number of times of the fine adjustment reaches a preset number, stopping finely adjusting the delay control signal.

Optionally, the digital delay-locked loop locking method further comprises: the delay line comprising N identical delay cells connected in series, when N is an even number, locking the minimum delay time on an odd multiple of the clock cycle of the input clock signal.

Optionally, the digital delay-locked loop locking method further comprises: in the digital delay-locked loop that uses a clock phase switching circuit, determining a phase swap signal according to the locked range of the minimum delay time.

Optionally, the delay line comprising N identical delay cells connected in series, and when N is an even number, the clock phase switching circuit outputs an even multiple of the clock signal.

As stated above, the digital delay-locked loop and the locking method according to an embodiment of the present invention have the following beneficial effects: the harmonic locking problem of general DLLs is solved. For the delay line in the digital phase-locked loop, the minimum delay time thereof may be any time, which is no longer subject to a constraint that the minimum delay time of the digital delay-locked loop must be less than one cycle of the input clock signal; meanwhile, the design of the digital delay-locked loop is more flexible, and it is easier to design higher resolution.

Description about Reference Signs
1 digital delay-locked loop
11 frequency divider
12 signal selector
13 delay line
14 phase detector
15 state machine
S1-S4 step

DETAILED DESCRIPTION OF THE PREFERRED EMBODIMENTS

Implementations of the present invention are described below through specific examples, and those skilled in the art can easily understand other advantages and effects of the present invention according to the contents disclosed in the specification. The present invention can be implemented or applied through other different specific implementations, and various details in the specification can be modified or changed based on different opinions and applications without departing from the spirit of the present invention.

It should be noted that illustration provided in this embodiment merely describes the basic concept of the present invention schematically, then the figures only display components related to the present invention instead of being drawn according to the number, shapes and sizes of the components in actual implementation, the form, number and scale of each component in actual implementation may be a random change, and the layout type of the component may also be more complicated.

Figure 1:
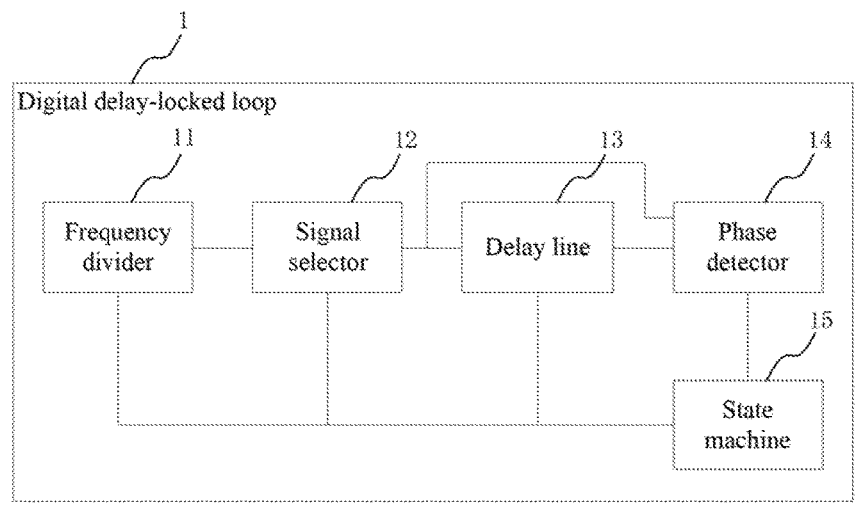
FIG. 1. is a schematic diagram of modules of a digital delay-locked loop according to an embodiment of the present invention.

The present invention provides a digital delay-locked loop. In one embodiment, as shown in FIG. 1, the digital delay-locked loop 1 comprises a frequency divider 11, a signal selector 12, a delay line 13, a phase detector 14 and a state machine 15.

The frequency divider 11 is used to receive a first clock signal and frequency division information, perform frequency division processing on the first clock signal according to the frequency division information, and output a second clock signal; the frequency division information comprises the specified dividing ratio and the specified duty cycle. The frequency division information is provided by the state machine 15. The frequency divider 11 may also be called a programming divider, which can perform frequency division on an input clock signal (the first clock signal)

according to a received control signal which comprises a frequency dividing ratio signal and a duty ratio signal, to obtain and output a frequency division clock signal which meets frequency dividing ratio and duty ratio requirements, that is, a second clock signal.

The signal selector 12 is connected with the frequency divider 11, used to receive the first clock signal, the second clock signal and a selection signal, and select the first clock signal or the second clock signal to be output as a third clock signal according to the selection signal. The selection signal is provided by the state machine 15. In order to achieve the delay control of a DLL whose minimum delay time exceeds one cycle, it is necessary to select the frequency division clock signal (second clock signal) provided by the frequency divider 11. After a delay control signal is determined, the original input clock (first clock signal) can be recovered for use.

The delay line 13 is connected with the signal selector 12, used to receive the third clock signal and a delay control signal, delay the third clock signal according to the delay control signal, and output a fourth clock signal. The delay control signal is provided by the state machine 15. As the delay line 13 per se will generate a certain delay time, the delay time of the delay line 13 per se may be called minimum delay time, and the delay time finally generated by the delay line 13 is the minimum delay time plus the delay time generated by the control of the delay control signal. In one embodiment, the delay line 13 comprises N identical delay cells connected in series, an input of the first delay cell connected in series is an input of the delay line 13, and an output of the last delay cell connected in series is an output of the delay line 13; each delay cell receives the delay control signal, performs corresponding delay processing on a clock signal input in the delay cell according to the delay control signal, and outputs a delayed clock signal. N is a natural number. When N=1, the output clock signal and the fourth signal are the same signal. The delay line further outputs N phase clock signals; when N>=2, the N phase clock signals are respectively input signals of the N delay cells connected in series. In one embodiment, the digital delay-locked loop 1 further comprises a clock phase switching circuit, which comprises N input ends, N output ends and a control end; the N phase clock signals output by the delay line are input to the N input ends of the clock phase switching circuit; the state machine is further used to determine and output a phase swap signal according to a set state logic, and the control end of the clock phase switching circuit receives the phase swap signal, and adjusts output positions of the input signals according to the phase swap signal, to ensure that a phase difference between signals output by any two adjacent positions of the N output ends is a 1/N clock cycle of the first clock. As a preferred solution, the N is an even number, and the clock phase switching circuit outputs an odd number of phase clock signals.

The phase detector 14 is connected with the signal selector 12 and the delay line 13, used to receive the third clock signal and the fourth clock signal, perform a phase detection processing, and output a phase detection judgment signal. The phase detection judgment signal is used to judge a range of the minimum delay time of the delay line 13, and then used to adjust a phase difference between the output clock signal (fourth clock signal) of the delay line 13 and the input clock signal (third clock signal) of the delay line 13.

The state machine 15 is connected with the frequency divider 11, the signal selector 12, the delay line 13 and the phase detector 14, used to receive the phase detection judgment signal, and adjust and control the frequency division information, the selection signal and the delay control signal output according to the phase detection judgment signal and the set state logic, to achieve that delay time of the fourth clock signal relative to the first clock signal is a multiple of a cycle of the first clock signal. The state machine 15 sets initial signals of the frequency division information, the selection signal and the delay control signal, and performs state transition according to the phase detection judgment signal obtained by the phase detector 14, to adjust the frequency division information, the selection signal and the delay control signal. The delay control signal is finally determined through adjustment, to achieve that delay time of the fourth clock signal relative to the first clock signal is a multiple of a cycle of the first dock signal.

Figure 2:
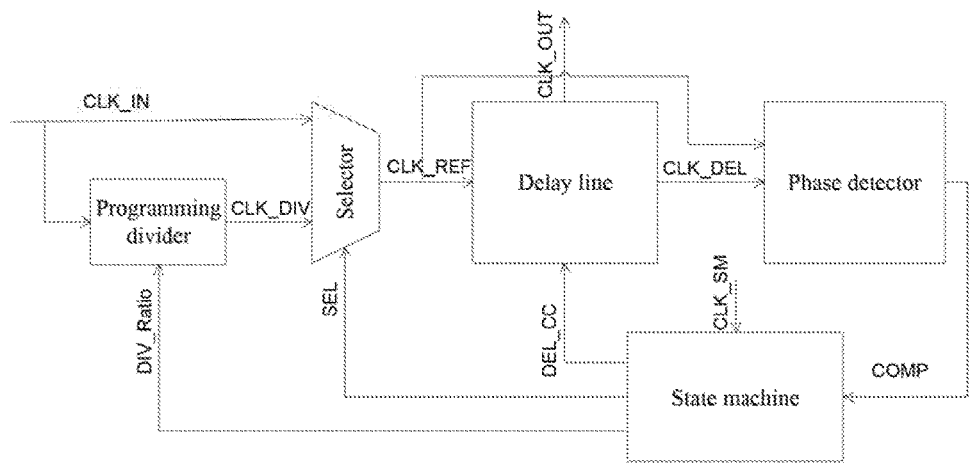
FIG. 2 is a schematic diagram of a system structure of a digital delay-locked loop according to an embodiment of the present invention.

In one embodiment, as shown in FIG. 2, the digital delay-locked loop 1 comprises a programming DIVIDER (i.e., the frequency divider 11), a selector (i.e., the signal selector 12, MUX2X1), a delay line 13, a phase detector 14 and a state machine 15. Wherein, the frequency divider 11 receives frequency division information (DIV_Ratio) output by the state machine 15, which comprises a frequency dividing ratio signal and a duty ratio signal. The frequency divider 11 receives a first clock signal (CLK_IN) input, and outputs a second clock signal (CLK_DIV); and the second clock signal is a clock signal that meets requirements of the frequency division information. The signal selector 12 receives the first clock signal (CLK_IN) and the second clock signal (CLK_DIV), and the signal selector 12 receives a selection signal (SEL), and selects and outputs a third clock signal according to the selection signal, which comprises that the third clock signal output is identical to the first clock signal (CLK_REF=CLK_IN) or the third clock signal output is identical to the second clock signal (CLK_REF=CLK_DIV). The delay line 13 receives the third clock signal, and outputs a delayed fourth clock signal (CLK_DEL) according to a received delay control signal (DEL_CC), and the delay line 13 further outputs a clock CLK_OUT as an output clock of the digital delay-locked loop 1 in the meanwhile. The phase detector 13 receives the third clock signal (CLK_REF) and the fourth clock signal (CLK_DEL), and outputs a phase detection judgment signal COMP. The state machine 15 sets initial values of the DIV_Ratio, the SEL and the DEL_CC, and adjusts values of the DIV_Ratio, the SEL and the DEL_CC according to the value of the COMP.

Figure 3:
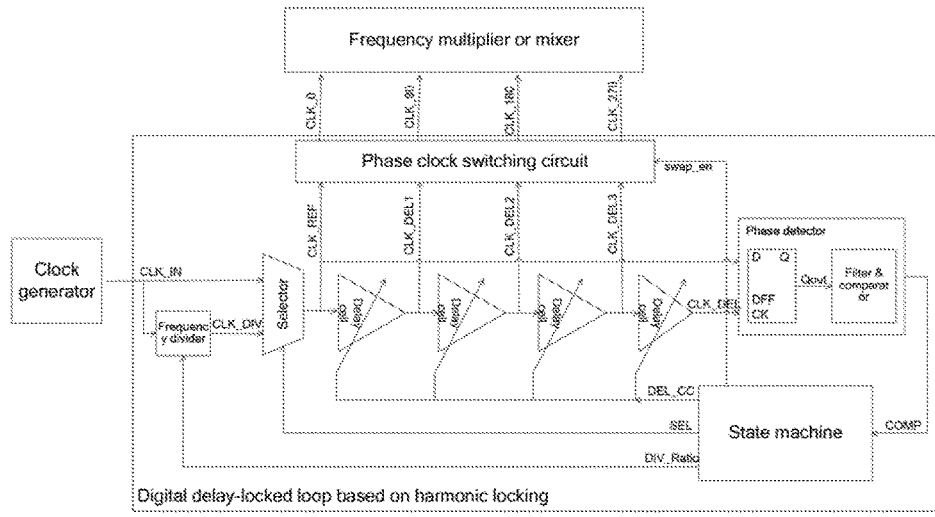
FIG. 3 is a schematic diagram of a circuit structure of a digital delay-locked loop according to an embodiment of the present invention.

In one embodiment, as shown in FIG. 3, the digital delay-locked loop 1 further comprises a phase clock switching circuit, and the delay line of the digital delay-locked loop 1 consists of four identical delay cells (the delay line is embodied as four dig-delay cells connected in series). The delay line can output four phase clock signals CLK_REF, CLK_DEL1, CLK_DEL2 and CLK_DEL3, and the four output phase clock signals are respectively input signals of the four delay cells connected in series. The output four phase clock signals CLK_REF, CLK_DEL1, CLK_DEL2 and CLK_DEL3 are input into the phase clock switching circuit, the phase clock switching circuit receives a phase swap signal (swap_en), and adjusts CLK_REF, CLK_DEL1, CLK_DEL2 and CLK_DEL3 as four phase clock signals (CLK_0, CLK_90 , CLK_180 and CLK_270) to be output, CLK_0, CLK_90, CLK_180 and CLK_270 respectively represent that phase differences between them and the original input clock signal (the first clock signal, CLK_IN) are 0°, 90°, 180° and 270°, and their phase space is ¼ of a clock cycle of the input clock signal. The phase difference being 360° and the phase difference being 0° are the same, both representing that the phase difference between one output clock signal and the first clock signal is a multiple of a clock cycle of the first clock signal. In other embodiments, the output four phase clock signals CLK_REF, CLK_DEL1, CLK$_{DEL}$2 and CLK$_{DEL}$3 may also be directly input into a frequency multiplier or a mixer.

Figure 4:
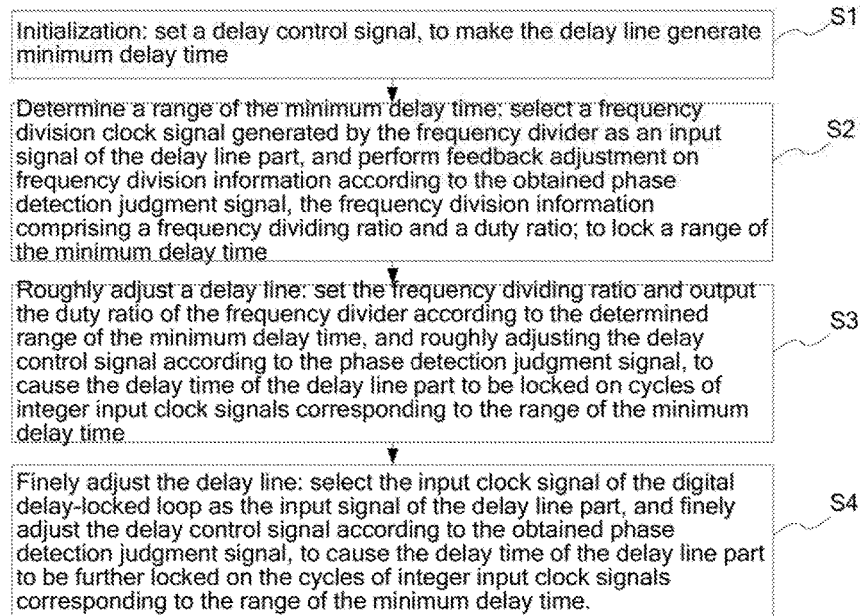
FIG. 4 is a schematic flowchart of a digital delay-locked loop locking method according to an embodiment of the present invention.

The present invention further provides a digital delay-locked loop locking method, applied to the digital delay-locked loop as described above. In one embodiment, as shown in FIG. 4, the digital delay-locked loop locking method comprises:

Step S1: set a delay control signal, to make the delay line generate minimum delay time. Specifically, the value of the delay control signal for generating the minimum delay time is related to the delay line, and is determined by the delay line. The state machine of the digital delay-locked loop sets an initial delay control signal to generate minimum delay time, and generally, when it is set that the delay control signal is 0, the delay time generated by the delay line is the minimum delay time.

Step S2: select a frequency division clock signal generated by the frequency divider as an input signal of the delay line, and set frequency division information of the frequency divider, which comprises a frequency dividing ratio and a duty ratio; perform feedback adjustment on the frequency division information according to the obtained phase detection judgment signal, to determine a range of the minimum delay time The frequency dividing ratio refers to a frequency dividing ratio of an output signal of the frequency divider, and the duty ratio refers to a duty ratio of the output signal of the frequency divider; in one embodiment, when the digital delay-locked loop is started, the input signal of the delay line is switched to an output of the programming divider, and a range of the minimum delay time Tdel_min of the digital delay line is judged in combination with an algorithm of the state machine, for example, the magnitude relationships between the minimum delay time Tdel_min of the digital delay line and 1×Tclk, 3×Tclk and 5×Tclk, and in some embodiments, Tclk <10 ns, but the present invention is not limited thereto, wherein Tclk may also be any other suitable values.

Step S3: after the range of the minimum delay time is determined, reset the frequency division information to cause the frequency divider to output a new frequency dividing ratio and a duty ratio; roughly adjust the delay control signal according to the obtained phase detection judgment signal, to cause the delay time of the delay line to be locked on or near cycles of an integral number of input clock signals corresponding to the minimum delay time. In one embodiment, the delay control signal is a roughly adjusted delay control signal. In one embodiment, when the minimum delay time Tdel_min of the digital delay line is less than the clock cycle Tclk of the input clock (CLK_IN), the delay time of the delay line is finally locked on the position of 1×Tclk. When the minimum delay time Tdel_min of the digital delay line is greater than 3×Tclk and less than 5×Tclk, the delay time of the delay line is finally locked on the position of 5×Tclk. When the minimum delay time Tdel_min of the digital delay line is greater than 1×Tclk and less than 3×Tclk, the delay time of the delay line may be locked on the position of 3×Tclk. In one embodiment, when the digital delay-locked loop is started, the input signal of the delay line is switched to the output of the programming divider, and the range of the minimum delay time Tdel_min is judged in combination with an algorithm of the state machine. In one embodiment, according to the range of the minimum delay time determined in step S2, the frequency dividing ratio (DIV_Ratio) of the frequency divider and the duty ratio of the output signal of the frequency divider are reset; the delay control signal is adjusted according to the obtained phase detection judgment signal COMP, to cause the clock signal output by the delay line to be locked on integral-multiple input clock cycles corresponding to the range of the minimum delay time. At the same time, the control signal swap_en of the phase clock switching circuit is adjusted. In one embodiment, when the minimum delay time Tdel_min of the digital delay line is less than the clock cycle Tclk of the input clock (CLK_IN), the delay time of the delay line is finally locked on the position of 1×Tclk, and SWAP_EN is set to be 0; when the minimum delay time Tdel_min of the digital delay line is greater than 3×Tclk and less than 5×Tclk, the delay time of the delay line is finally locked on the position of 5×Tclk, and SWAP_EN is set to be 0; when the minimum delay time T_del min of the digital delay line is greater than 1×Tclk and less than 3×Tclk, the delay time of the delay line may be locked on the position of 3×Tclk, and SWAP_EN is set to be 1.

In another embodiment, the method may further comprise step S4: when the input clock signal of the digital delay-locked loop is selected as the input signal of the delay line, finely adjust the delay control signal according to the obtained phase detection judgment signal, to cause a phase difference between the fourth clock signal (CLK_DEL) output by the delay line and the clock signal input to the delay line to be less than or equal to unit delay time of one delay line (that is, finely adjust resolution of the delay line).

In one embodiment, the digital delay-locked loop locking method further comprises: when the continuous increasing or decreasing number of times of the fine adjustment reaches a preset number, stopping finely adjusting the delay control signal. As a preferred solution, the digital delay-locked loop locking method further comprises: when N is an even number, locking the minimum delay time on odd multiple numbers of clock cycle of the input clock signal. When N is an odd number, the minimum delay time is locked on integer clock cycles of the input clock signal.

In one embodiment, the delay control signal comprises a roughly adjusted delay control signal and a finely adjusted delay control signal, both of which are used to control the delay line or the delay cells in the delay line, and the state machine adjusts the roughly adjusted delay control signal through rough adjustment, and adjusts the finely adjusted delay control signal through fine adjustment. In one embodiment, the digital delay-locked loop locking method further comprises: finely adjusting the delay control signal according to the obtained phase detection judgment signal, to cause the delay time of the delay line to be locked on cycles of an integral number of input clock signals CLK_IN corresponding to the minimum delay time. Specifically, after the rough adjustment ends and the fine adjustment proceeds and after the loop is stable, the fine adjustment CF will oscillate back and forth (i.e., dynamically lock) near a target value, and when the number of times of oscillation reaches a preset number, the fine adjustment on the delay control signal is stopped; or the DLL is in a dynamic locking process all the time.

In one embodiment, the digital delay-locked loop locking method further comprises: in the digital delay-locked loop that uses a clock phase switching circuit, determining a phase swap signal according to the locked range of the minimum delay time. In one embodiment, the clock phase switching circuit outputs an even-numbered clock signal.

Figure 5:
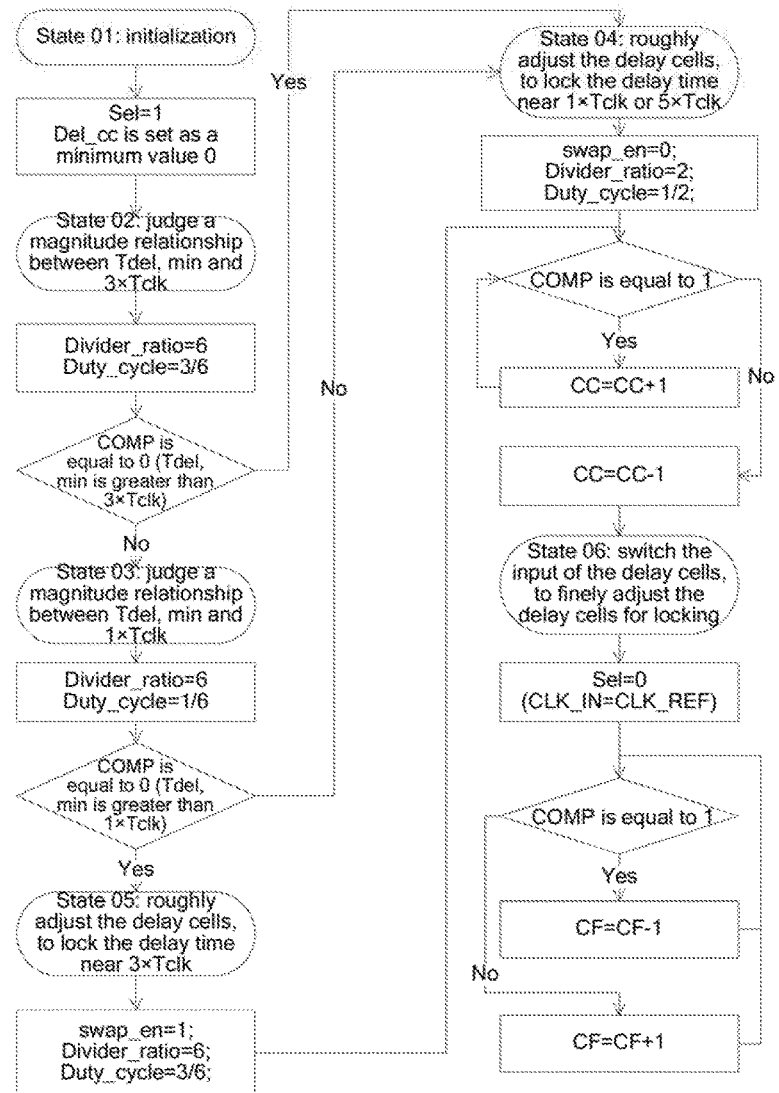
FIG. 5 is a schematic flowchart of control of a state machine of a digital delay-locked loop locking method according to an embodiment of the present invention.

In one embodiment, the digital delay-locked loop is as shown in FIG. 3, and the state control logic of the state machine of the digital delay-locked loop locking method used is as shown in FIG. 5. The state 01 of the state machine is an initial state: the selection signal (SEL)=1, and DEL_CC is configured to control the delay line to output the minimum delay time. That is, the state machine sets the initial state (state 01) as follows: the selection signal SEL of the signal selector output is set as 1, to make the digital delay line input signal CLK_REF come from output of the programming divider, that is, select a frequency division clock signal; the output delay control signal is configured to cause the delay time output by the delay line to be minimum, and suppose, at this point, DEL_CC=DEL_CC_O, generally, DEL_CC_O=0. At this time, the delay line outputs the minimum delay time Tdel_min.

Figure 6:
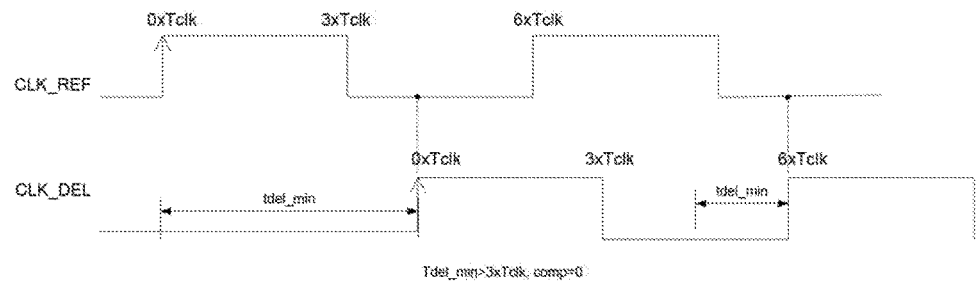
FIG. 6 is a schematic diagram of timing sequence comparison of input signals of a phase detector of a digital delay-locked loop locking method according to an embodiment of the present invention.
Figure 7:
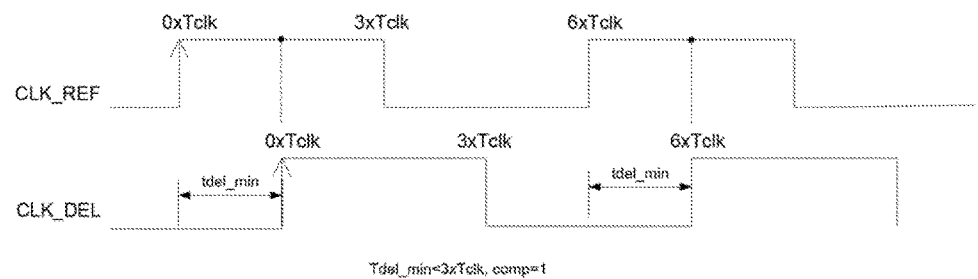
FIG. 7 is a schematic diagram of timing sequence comparison of input signals of a phase detector of a digital delay-locked loop locking method according to an embodiment of the present invention.

In the state 02, the magnitude relationship between the minimum delay time Tdel_min of the delay line and 3×Tclk is judged according to the output COMP (or Comp) of the phase detector. The state machine first sets that, in the frequency division information (DIV_Ratio) of the frequency divider, the frequency dividing ratio signal Divider_ratio=6, and the duty ratio signal Duty_cycle=3/6. At this point, the phase detector will output a phase detection judgment signal COMP. When the COMP signal received by the state machine is equal to 0, referring to FIG. 6, it indicates that the minimum delay time Tdel_min of the delay line is greater than 3×Tclk (the clock cycle of the input clock), and next, the state machine jumps to the state 04; on the contrary, when the COMP signal received by the state machine is equal to 1, referring to FIG. 7, it indicates that the minimum delay time Tdel_min of the delay line is less than 3×Tclk, and next, the state machine jumps to the state 03.

Figure 8:
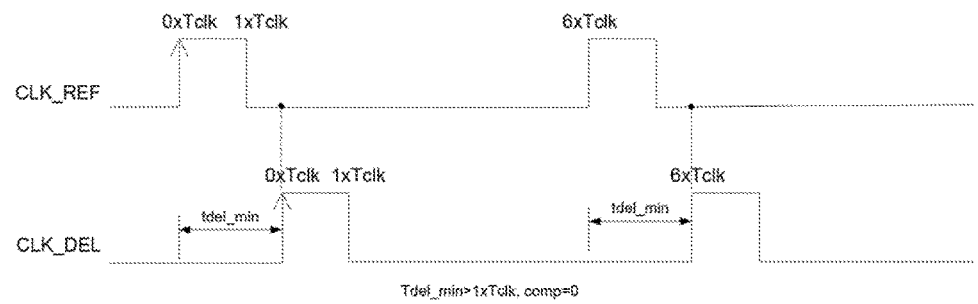
FIG. 8 is a schematic diagram of timing sequence comparison of input signals of a phase detector of a digital delay-locked loop locking method according to an embodiment of the present invention.
Figure 9:
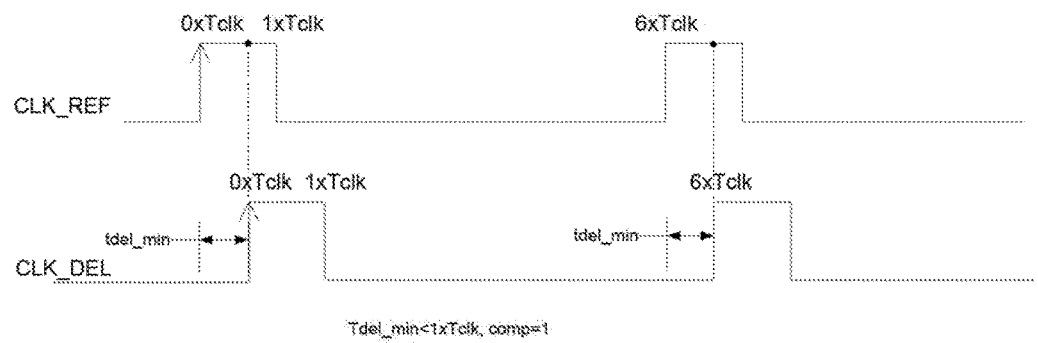
FIG. 9 is a schematic diagram of timing sequence comparison of input signals of a phase detector of a digital delay-locked loop locking method according to an embodiment of the present invention.

In the state 03, the magnitude relationship between the minimum delay time Tdel_min of the delay line and 1×Tclk is judged according to the output COMP of the phase detector. The state machine first sets that, in the frequency division information (DIV_Ratio) of the frequency divider, the frequency dividing ratio signal Divider_ratio=6, and the duty ratio signal Duty_cycle=1/6. At this point, the phase detector will output a phase detection judgment signal COMP. When the COMP signal received by the state machine is equal to 0, referring to FIG. 8, it indicates that the minimum delay time Tdel_min of the delay line is greater than 1×Tclk (the clock cycle of the input clock), and next, the state machine jumps to the state 05; on the contrary, when the COMP signal received by the state machine is equal to 1, referring to FIG. 9, it indicates that the minimum delay time Tdel_min of the delay line is less than 1×Tclk, and next, the state machine jumps to the state 04.

In the state 04, the state machine roughly adjusts the delay control signal DEL_CC of the delay line, and locks the delay time of the delay line to 1×Tclk or 5×Tclk. The state machine first sets that, in the frequency division information (DIV_Ratio) of the frequency divider, the frequency dividing ratio signal Divider_ratio=2, and the duty ratio signal Duty_cycle=1/2; sets that the input signal swap_en of the clock phase switching circuit is 0; and adjusts the delay control signal according to the value of an output COMP of the comparator. At this point, the adjustment on the delay control signal is rough adjustment, the magnitude of the rough adjustment is represented with the value of CC, and when COMP==1, CC=CC+1; until COMP==0, CC=CC−1, the cycle repeats, and the digital delay-locked loop can he in the state 04 all the time, that is, CC varies with the value of the COMP all the time, and oscillates back and forth near the target value of CC, to achieve dynamic locking; in another embodiment, after the state machine enters the state 04, the state machine stops operating after the number of times the CC or COMP oscillates back and forth reaches a certain preset value, to achieve static locking.

In still another embodiment, rough adjustment is carried out in the state 04, and until COMP==0, CC=CC−1, and the state of the state machine jumps to the state 06.

In the state 05, the state machine roughly adjusts the delay control signal DEL_CC of the delay line, to lock the delay time of the delay line near 3×Tclk. The state machine first sets that, in the frequency division information (DIV_Ratio) of the frequency divider, the frequency dividing ratio signal Divider_ratio=6, and the duty ratio signal Duty_cycle=3/6; sets that the input signal swap_en of the clock phase switching circuit is 1; and adjusts the delay control signal according to the value of an output COMP of the comparator. At this point, the adjustment on the delay control signal is rough adjustment, the magnitude of the rough adjustment is represented with the value of CC, and when COMP==1, CC=CC+1; until COMP==0, CC=CC−1, the cycle repeats, and the digital delay-locked loop can be in the state 05 all the time, that is, CC varies with the value of the COMP all the time, and oscillates back and forth near the target value of CC, to achieve dynamic locking; in another embodiment, after the state machine enters the state 05, the state machine stops operating after the number of times the CC or COMP oscillates back and forth reaches a certain preset value, to achieve static locking.

In another embodiment, rough adjustment is carded out in the state 05, and until COMP==0, CC=CC−1, and the state of the state machine can further jump to the state 06.

In the state 06, the delay line switches to the signal CLK_IN, and the state machine finely adjusts the delay control signal DEL_CF of the delay line, and locks the digital delay-locked loop. The state machine sets the selection signal SEL of the signal selector to be equal to 0, that is, the delay line input CLK_REF signal is switched to the system input signal CLK_IN, and the delay control signal is adjusted according to the value of the output COMP of the comparator. At this point, the adjustment on the delay control signal is fine adjustment, the magnitude of the fine adjustment is represented with the value of CF, and when COMP==1, CF=CF−1; until COMP==0, CF=CF+1; the cycle repeats.

The digital delay-locked loop can be in the state 06 all the time, that is, CF varies with the value of the COMP all the time, and oscillates back and forth near the target value of CF, to achieve dynamic locking; it is also feasible that, after the state machine enters the state 06, the state machine stops operating after the number of times the CF or COMP oscillates back and forth reaches a certain preset value, to achieve static locking.

Figure 10:
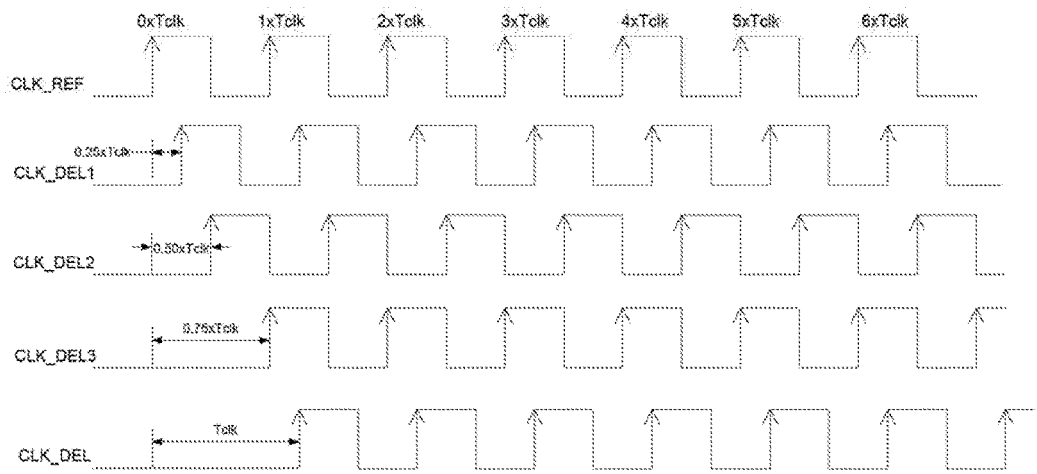
FIG. 10 is a schematic diagram of timing sequence comparison of output signals of a delay circuit of a digital delay-locked loop locking method according to an embodiment of the present invention.
Figure 11:
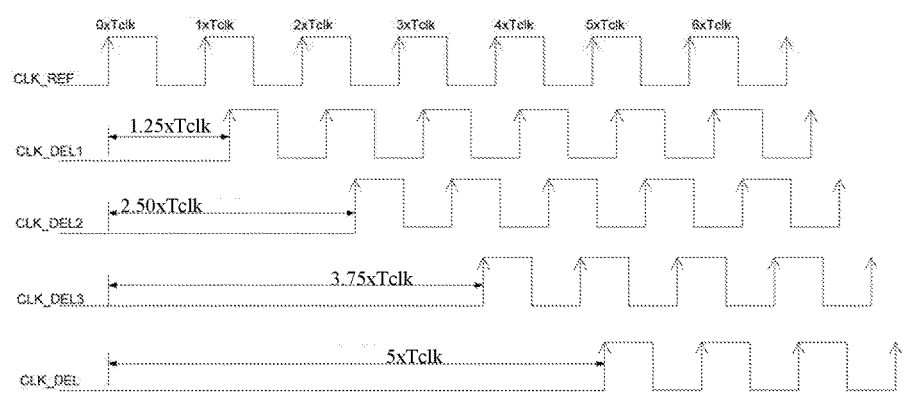
FIG. 11 is a schematic diagram of timing sequence comparison of output signals of a delay circuit of a digital delay-locked loop locking method according to an embodiment of the present invention.
Figure 12:
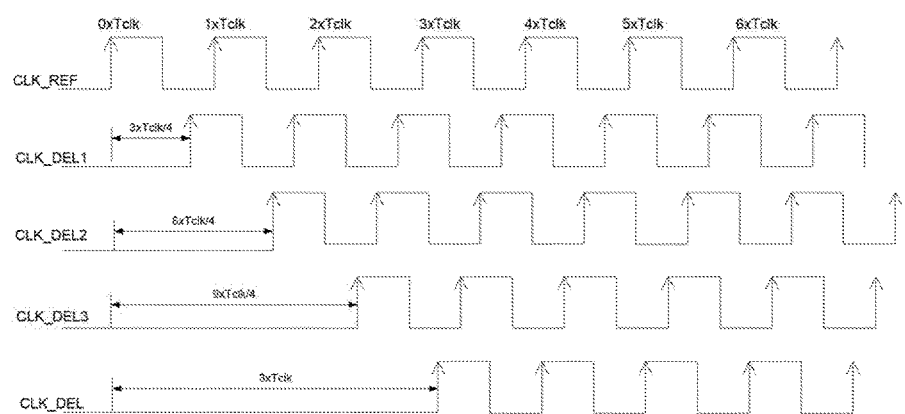
FIG. 12 is a schematic diagram of timing sequence comparison of output signals of a delay circuit of a digital delay-locked loop locking method according to an embodiment of the present invention.

Finally, in different ranges of the minimum delay time, four phase clock signals output by the digital delay-locked loop are as shown in FIGS. 10 to 12. FIG. 10 shows the phase relationship between the four phase clock signals and the output clock signal when the minimum delay time is less than 1×Tclk (clock cycle of the input clock), and the delay line is finally locked at 1×Tclk. FIG. 11 shows the phase relationship between the four phase clock signals and the output clock signal when the minimum delay time is greater than 3×Tclk (clock cycle of the input clock), and the delay line is finally locked between 5×Tclk. FIG. 12 shows the phase relationship at the four phase clock signals and the output clock signal when the minimum delay time is less than 3×Tclk and greater than 1×Tclk (clock cycle of the input clock), and the delay line is finally locked at 3×Tclk.

To sum up, the present invention makes the minimum delay time of the digital delay-locked loop not subject to a limitation of being less than one input clock cycle, and solves the harmonic locking problem of general DLLs. For the delay line in the digital delay-locked loop, its minimum delay time may be any time, and is no longer constrained by the traditional digital delay-locked loop; meanwhile, design of the digital delay-locked loop is more flexible, and it is easier to design higher resolution. Therefore, the present invention effectively overcomes various shortcomings in the prior art, and has a high industrial utilization value.

The embodiments merely exemplarily describe the principle and effects of the present invention, but are not to limit the present invention. Any person skilled in the art can make modifications and variations to the embodiments without departing from the spirit and category of the present invention. Therefore, all modifications or variations completed by those with ordinary skill in the art without departing from the spirit and technical thoughts disclosed by the present invention should be covered by the claims of the present invention.

What is claimed is:

1. A digital delay-locked loop, wherein the digital delay-locked loop comprises:
    a frequency divider, used to receive a first clock signal and frequency division information, perform frequency division processing on the first clock signal according to the frequency division information, and output a second clock signal, wherein the frequency division information comprises the specified dividing ratio and the specified duty cycle;
    a signal selector connected with the frequency divider, used to receive the first clock signal, the second clock signal and a selection signal, and select the first clock signal or the second clock signal as a third clock signal output according to the selection signal;
    a delay line connected with the signal selector, used to receive the third clock signal and a delay control signal, delay the third clock signal according to the delay control signal, and output a fourth clock signal;
    a phase detector connected with the signal selector and the delay line, used to receive the third clock signal and the fourth clock signal, perform phase detection processing, and output a phase detection judgment signal; and
    a state machine connected with the frequency divider, the signal selector, the delay line and the phase detector, used to receive the phase detection judgment signal, and adjust the output frequency division information, the selection signal and the delay control signal according to the phase detection judgment signal and a set state logic, to achieve that delay time of the fourth clock signal relative to the first clock signal is a multiple of a cycle of the first clock signal.

2. The digital delay-locked loop as in claim 1, wherein the delay line comprises N identical delay cells connected in series, N is a natural number, an input of the first delay cell connected in series is an input of the delay line, and an output of the last delay cell connected in series is an output of the delay line; each delay cell receives the delay control signal, performs corresponding delay processing on a clock signal input in the delay cell according to the delay control signal, and outputs a delayed clock signal.

3. The digital delay-locked loop as in claim 2, wherein the delay line further outputs N phase clock signals; when N>=2, the N phase clock signals are respectively input signals of the N delay cells connected in series.

4. The digital delay-locked loop as in claim 2, wherein the digital delay-locked loop further comprises a clock phase switching circuit, which comprises N input ends, N output ends and a control end; the N phase clock signals output by the delay line are input to N input ends of the clock phase switching circuit; the state machine is further used to determine and output a phase swap signal according to the set state logic, and the control end of the clock phase switching circuit receives the phase swap signal, and adjusts output positions of the input signals according to the phase swap signal, to ensure that a phase difference between signals output by any two adjacent positions of the N output ends is 1/N of a clock cycle of a first clock.

5. A digital delay-locked loop locking method, applied to the digital delay-locked loop as in claim 1, wherein the digital delay -locked loop locking method comprises:
    setting a delay control signal, to make the delay line generate minimum delay time;
    selecting a frequency division clock signal generated by the frequency divider as an input signal of the delay line, and performing feedback adjustment on the frequency division information according to the obtained phase detection judgment signal, to lock a range of the minimum delay time, wherein the frequency division signal comprises a frequency dividing ratio and a duty ratio; and
    resetting the frequency dividing ratio and the output duty ratio of the frequency divider according to the locked range of the minimum delay time, and roughly adjusting the delay control signal according to the phase detection judgment signal, to cause the delay time of the delay line to be locked on cycles of an integer multiple of the input clock signals corresponding to the range of the minimum delay time.

6. The digital delay-locked loop locking method as in claim 5, wherein the digital delay-locked loop locking method further comprises: selecting the input clock signal of the digital delay-locked loop as the input signal of the delay line, and finely adjusting the delay control signal according to the obtained phase detection judgment signal, to cause the delay time of the delay line to be locked on the cycles of an integer multiple of the input clock signals corresponding to the range of the minimum delay time.

7. The digital delay-locked loop locking method as in claim 6, wherein the digital delay-locked loop locking method further comprises: when the number of times the fine adjustment increases or decreases reaches a preset number, stopping finely adjusting the delay control signal.

8. The digital delay-locked loop locking method as in claim 6, wherein the frequency division information, the selection signal, the roughly adjusted delay control signal and the finely adjusted delay control signal are adjusted according to the phase detection judgment signal and the set state logic through the state machine.

9. The digital delay-locked loop locking method as in claim 5, wherein the digital delay-locked loop locking method further comprises: in the digital delay-locked loop that uses a clock phase switching circuit, determining a phase swap signal according to the locked range of the minimum delay time.

10. The digital delay-locked loop locking method as in claim 5, wherein the frequency division information, the selection signal and the roughly adjusted delay control signal are adjusted according to the phase detection judgment signal and the set state logic through the state machine.

11. The digital delay-locked loop locking method as in claim 5, wherein the digital delay-locked loop locking method further comprises: the delay line comprising N identical delay cells connected in series, when N is equal to an even number, locking the minimum delay time on an odd multiple of clock cycle of the input clock signal.

* * * * *